US008836131B2

(12) United States Patent
Kanschat et al.

(10) Patent No.: US 8,836,131 B2
(45) Date of Patent: Sep. 16, 2014

(54) SEMICONDUCTOR MODULE WITH EDGE TERMINATION AND PROCESS FOR ITS FABRICATION

(75) Inventors: Peter Kanschat, Soest (DE); Indrajit Paul, Soest (DE)

(73) Assignee: Infineon Technologies AG, Neubiberg (DE)

( * ) Notice: Subject to any disclaimer, the term of this patent is extended or adjusted under 35 U.S.C. 154(b) by 693 days.

(21) Appl. No.: 12/622,329

(22) Filed: Nov. 19, 2009

(65) Prior Publication Data

US 2010/0127400 A1 May 27, 2010

(30) Foreign Application Priority Data

Nov. 19, 2008 (DE) .......................... 10 2008 058 003

(51) Int. Cl.
*H01L 29/02* (2006.01)
*H01L 29/786* (2006.01)
(Continued)

(52) U.S. Cl.
CPC ............ *H01L 23/3121* (2013.01); *H01L 24/82* (2013.01); *H01L 23/5389* (2013.01); *H01L 2924/01078* (2013.01); *H01L 2224/24226* (2013.01); *H01L 2924/01032* (2013.01);
(Continued)

(58) Field of Classification Search
CPC .................. H01L 2924/00014; H01L 29/872;
H01L 29/0619; H01L 29/402; H01L 29/7811;
H01L 2924/19043; H01L 2924/01033; H01L
24/24; H01L 2224/24051; H01L 2924/3011;
H01L 2924/30107; H01L 2924/01005; H01L
2224/24226; H01L 2924/01078; H01L 24/82;
H01L 23/3121; H01L 23/25389; H01L
2924/01032; H01L 2924/01082; H01L
2924/01068; H01L 2924/01029
USPC .......... 257/171, 620, 773, 691, 354, 452, 483
See application file for complete search history.

(56) References Cited

U.S. PATENT DOCUMENTS 3,559,006 A * 1/1971 Otsuka et al. .................... 57/170
3,893,155 A * 7/1975 Ogiue ........................... 257/331
(Continued)

FOREIGN PATENT DOCUMENTS

DE 10303103 A1 8/2004
DE 102004019443 B3 8/2005
(Continued)

OTHER PUBLICATIONS

C. Goebl, P. Beckedahl, "A New 3D Power Module Packaging Without Bond Wires", PCIM Europe 2008, Nuremberg, Germany (2008).

*Primary Examiner* — Teresa M Arroyo
(74) *Attorney, Agent, or Firm* — Dicke, Billig & Czaja, PLLC

(57) ABSTRACT

A semiconductor module is disclosed, including a substrate and at least one semiconductor component in bottom contact with the substrate. The semiconductor component including a main current branch sandwiched between the bottom and top of the semiconductor component. The side edges of a barrier layer zone coincide with the side edge portions of the semiconductor component between the top and the bottom. The space above the substrate and to the side of the semiconductor component is packed with an insulating compound at least up to the level of the top of the semiconductor component. Topping the semiconductor component and parallel thereto is a patterned or unpatterned metallization connected to a contact pad on the top of the semiconductor component.

11 Claims, 6 Drawing Sheets

(51) Int. Cl.
  *H01L 31/102* (2006.01)
  *H01L 29/66* (2006.01)
  *H01L 23/544* (2006.01)
  *H01L 23/52* (2006.01)
  *H01L 23/48* (2006.01)
  *H01L 29/40* (2006.01)
  *H01L 23/00* (2006.01)
  *H01L 23/538* (2006.01)
  *H01L 23/31* (2006.01)

(52) U.S. Cl.
  CPC ...... *H01L 2924/01033* (2013.01); *H01L 24/24* (2013.01); *H01L 2924/01029* (2013.01); *H01L 2924/30107* (2013.01); *H01L 2924/19043* (2013.01); *H01L 2924/01082* (2013.01); *H01L 2224/24051* (2013.01); *H01L 2924/01005* (2013.01); *H01L 2924/01068* (2013.01); *H01L 2924/3011* (2013.01)
  USPC .......... 257/773; 257/171; 257/354; 257/452; 257/483; 257/620; 257/691

(56) References Cited

U.S. PATENT DOCUMENTS

| | | | | |
|---|---|---|---|---|
| 3,943,547 | A * | 3/1976 | Nagano et al. | 257/171 |
| 4,620,208 | A * | 10/1986 | Fritzsche et al. | 257/58 |
| 4,701,996 | A * | 10/1987 | Calviello | 438/173 |
| 4,965,173 | A * | 10/1990 | Gould | 438/614 |
| 5,637,922 | A | 6/1997 | Fillion et al. | |
| 5,858,814 | A | 1/1999 | Goossen et al. | |
| 6,054,727 | A * | 4/2000 | Voss | 257/109 |
| 6,538,302 | B1 * | 3/2003 | Schlereth | 257/620 |
| 6,825,514 | B2 * | 11/2004 | Deboy et al. | 257/285 |
| 6,949,468 | B2 * | 9/2005 | Lee et al. | 438/713 |
| 7,102,224 | B2 * | 9/2006 | Pahl | 257/704 |
| 7,402,457 | B2 | 7/2008 | Hase et al. | |
| 2006/0049527 | A1 * | 3/2006 | Hashimoto | 257/773 |
| 2006/0192301 | A1 * | 8/2006 | Leal et al. | 257/787 |
| 2007/0164419 | A1 * | 7/2007 | Sherrer et al. | 257/689 |
| 2008/0029879 | A1 * | 2/2008 | Tuckerman et al. | 257/704 |
| 2008/0093708 | A1 * | 4/2008 | Noma et al. | 257/620 |
| 2008/0128904 | A1 * | 6/2008 | Sakamoto | 257/737 |
| 2008/0203513 | A1 * | 8/2008 | Okada et al. | 257/435 |
| 2009/0263927 | A1 * | 10/2009 | Lin et al. | 438/66 |
| 2012/0094433 | A1 * | 4/2012 | Mizoguchi et al. | 438/104 |

FOREIGN PATENT DOCUMENTS

| | | |
|---|---|---|
| DE | 102005038260 B3 | 3/2007 |
| DE | 103 20 877 | 12/2009 |
| WO | 03/030247 | 4/2003 |
| WO | 2006042766 A1 | 4/2006 |

\* cited by examiner

US 8,836,131 B2

SEMICONDUCTOR MODULE WITH EDGE TERMINATION AND PROCESS FOR ITS FABRICATION

CROSS-REFERENCE TO RELATED APPLICATIONS

This Utility patent application claims priority to German Patent Application No. DE 10 2008 058 003.1-33, filed on Nov. 19, 2008, and incorporated herein by reference.

TECHNICAL FIELD

The invention relates to a semiconductor module and process for its fabrication.

BACKGROUND

Typical vertical semiconductor components feature at least one electric contact on the bottom surface and at least one electric contact on the top surface. These contacts are used, or example, in an OFF state of such a semiconductor component. The reverse voltage between the two surfaces makes it necessary to provide adequate electrical insulation in always taking into account the surface path along the edge of the semiconductor which drops all of the reverse voltage.

Within the semiconductor component and on its surface an electric insulation is customarily formed by appropriate insulation structures and edge termination design (e.g., field rings, field plates, etc.; see also Baliga, B. J.: Chapter 3.6: Edge Terminations, in: Power Semiconductor Devices, PWS Publishing Co., Boston, 1996). In cases where the semiconductor is surrounded by air and where dimensioning of the edge termination is not sufficient to resist a necessary reverse voltage, insulation may be provided by additional measures, by, for example, potting (e.g., molding) the semiconductor component. There is thus the need to achieve, on the one hand, a solution for electrically connecting the contacts facilitated and economically, and an adequate insulation between them, on the other.

For these and other reasons there is a need for the present invention.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAIL DESCRIPTION

Figure 1:
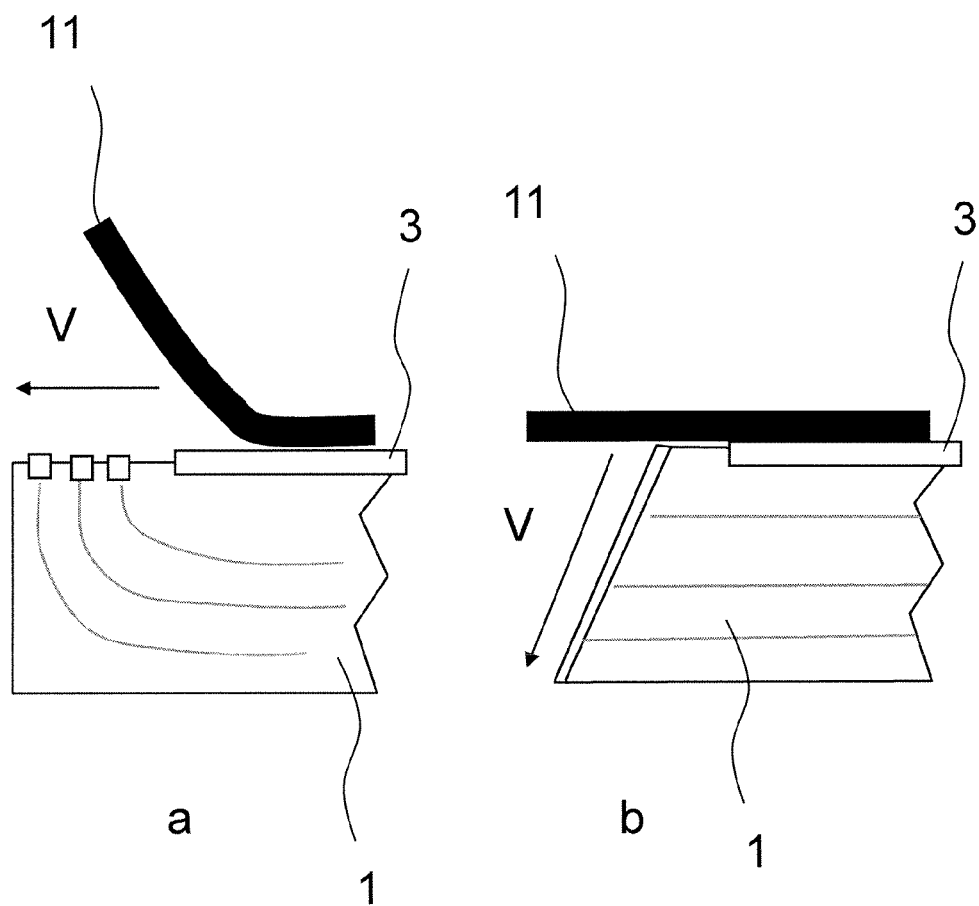
FIG. 1a is a vertical section view of the edge zone of a semiconductor component with a planar edge termination.
FIG. 1b is a section view of an edge zone of a semiconductor component with a vertical edge termination.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a semiconductor module including a substrate and at least one semiconductor component in bottom contact with the substrate. The semiconductor component including a main current branch sandwiched between the bottom and top of the semiconductor component in passing through a barrier layer zone which may be in an OFF or ON state. In regards to the current flow in the main current branch, the side edges of the barrier layer zone in this arrangement coincide with the side edge portions of the semiconductor component between the top and the bottom. In this semiconductor component, the voltage drop in an OFF state along each path in the plane of the top surface of the semiconductor is small as compared to the voltage drop along the path along the side edge of the semiconductor component (vertical edge). The space above the substrate and to the side of the semiconductor component is packed with an insulating compound at least up to the level of the top of the semiconductor component. Topping the semiconductor component and parallel thereto is a patterned or unpatterned metallization connected to a contact pad on the top of the semiconductor component.

In one embodiment a power semiconductor module is disclosed. The power semiconductor module includes a substrate and at least one semiconductor component in bottom contact with the substrate. The at least one semiconductor component includes a vertical edge termination, wherein the space above the substrate and to the side of the at least one semiconductor component is packed with an insulating compound up to the level of the top of the semiconductor component, so as to form a plain surface. A patterned or unpatterned metallization is arranged at the plain surface for contacting the top of the semiconductor component.

Another embodiment provides a process for fabricating one such semiconductor module. The process includes contacting the metallization of the substrate to the bottom of the semiconductor component. The space to the side of the semiconductor component and over the substrate up to at least the top of the semiconductor component is packed with an insulating compound to form a low-profile body. A patterned or unpatterned planar metallization is applied to the top of the semiconductor component at the side of the low-profile body facing away from the substrate. The metallization is bonded to the top of the semiconductor component.

Referring now to FIG. 1 there is illustrated a semiconductor component 1, including a cross-sectional view an edge termination zone of a semiconductor component 1 featuring differing edge termination structures. When the semiconductor component 1 has a planar edge termination (e.g., field rings) as illustrated in FIG. 1a a terminal 11 is bonded to a contact pad 3 of the semiconductor component 1 resulting in an electric terminal contact of the semiconductor component 1. The terminal 11 may be, for example, a bond wire. Due to the planar edge termination the terminal 11 is upswept resulting in what is called a 3D contact bump.

3D contact bumps are semiconductor contact bumps both bonded and soldered but which are complex and expensive to fabricate because the contact pads on the top of the semiconductor component may need to be covered to ensure a safe insulating spacing from the conductive contact bumps.

These drawbacks of a 3D contact bump are now avoided when semiconductor assemblies are used including a vertical edge termination (which is a collective term for various types of bevel edge terminations) as illustrated in FIG. 1b configured for instance by being etched. In fabrication of the present semiconductor modules one, two or more semiconductor components including a vertical edge termination are arranged on a substrate which, in addition to its mounting function, simultaneously results in contacting the bottom surface of the semiconductor.

FIGS. 2a-2f illustrate one example embodiment of fabricating a module on the patterned metallization of a DCB substrate 5 first the semiconductor component 1, an (optionally) metallic layer connector 8 and optional lead frame contacts 9 are applied and bonded (FIG. 2a). The resulting assembly is potted with an insulating plastics compound 2 to form a low-profile body wherein the tops of the contact pads of the semiconductor component 1, the layer connector 8 and the lead frame contacts 9 are in line with the top of the body formed by the plastics compound (FIG. 2b).

The top surface then receives a thin metallization layer 16, for example with the aid of a film, or by chemical vapor deposition (CVD) (FIG. 2c). This layer is then in turn covered by a mask 7 masking individual surface areas and maintaining other surface areas unmasked (FIG. 2d). In the next process the unmasked surface areas receive a relatively thick metallization layer 17, for example by plating (FIG. 2e). In conclusion, the mask 7 and the remains of the thin metallization located therebeneath are removed, for example, etched away (FIG. 2f).

When using a further substrate and metallized masking film a reliable electric contact may be provided between contact pads of the semiconductor component 1 and the metallization layer 17 by a variety of different processes, for example, soldering, adhesive cementing, crimping and ultrasonic welding.

FIG. 3a illustrates, by way of example a working process in application of ultrasonic welding as a bonding process in which with the aid of a ultrasonic welder 18 via a slotted copper mask the connection between a top patterned conductive layer (metallization or layer connector 8) and top contact pads of the semiconductor component 1 are produced.

FIG. 3b illustrates a further module, by way of example, including a substrate 5, a substrate 10, top and bottom patterned conductive layers (metallization or layer connectors 8), semiconductor component 1 with vertical edge terminations and an insulating plastics filler 2. In this arrangement the top and bottom patterned conductive layers are in turn connected to the top and bottom electric contact pads of the semiconductor component 1, the latter being arranged on the first substrate 5. Unlike the examples as already described, the assembly as illustrated in FIG. 3b includes in addition a second substrate 10 topping the semiconductor module in sealing, among other things, the top patterned conductive layer 8 (metallic layer connector) and the insulating filler 2 from the environment.

Figure 4:
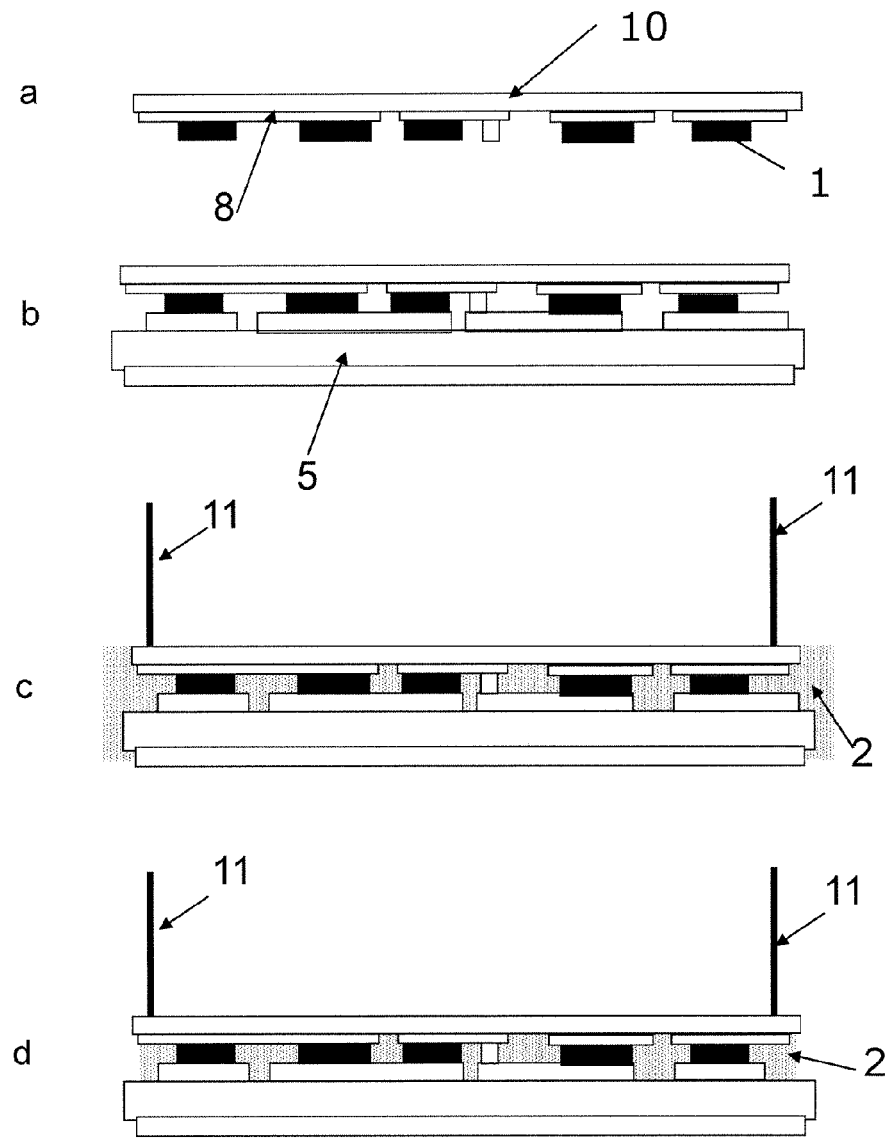
FIGS. 4a-4d illustrate processes in forming a further example module.

FIG. 4 illustrates one embodiment of a further module by way of example, first involving the semiconductor component 1 being secured by a flip-chip process, i.e., by its top to a patterned metallization of a top substrate 10 and electrically connected thereto, for example by a soldering procedure (FIG. 4a). Optionally a metallic layer connector 8 can be secured instead of the metallization 8 to the top substrate 10. After this, the assembly is applied to the bottom of the semiconductor component 1, firstly to the top patterned metallization of a bottom substrate 5 and connected thereto, for example, by soldering, low-temperature sintering or adhesive cementing (FIG. 4b). The assembly is sealed in a mold with insulating compound 2 by a filler or covering injection (FIG. 4c). Terminals 11 are connected, for example by soldering, impressing or friction welding to the intended contact pads of the patterned metallization. FIG. 4d illustrates an alternative embodiment of that as illustrated in FIG. 4c in which sealing is done with an insulating compound 2 which in this case is implemented, for example, by underfilling with a gel.

Figure 5:
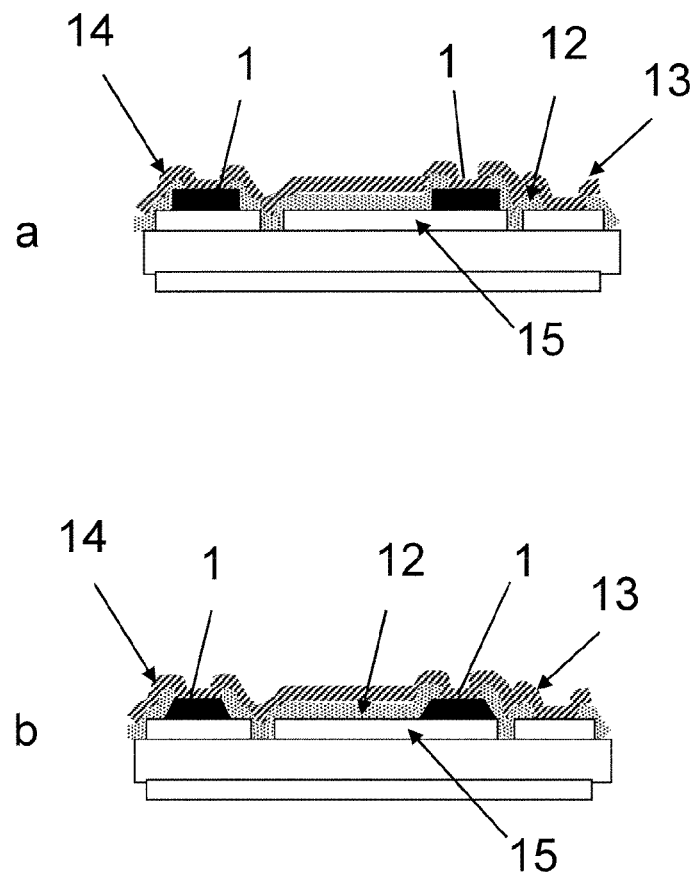
FIGS. 5a, 5b illustrate a section view of the edge zone of a semiconductor component in which two connecting layers are separated by a laminated film.

FIGS. 5a and 5b illustrate one embodiment of how, optionally laminated films may be used, including cross-sectional views of the edge zones of semiconductor components in which two connecting layers are separated by a laminated film. FIGS. 5a and 5b illustrate semiconductor components 1, laminated insulation films 12, semiconductor contacting layers 15 and plated metallizations 13. In this arrangement the laminated insulating film 12 separates and insulates the semiconductor contacting layer 15 from the second semiconductor contacting layer 13 which, for example, may be a plated metallization. This semiconductor contacting layer 13 makes the electrical contact to the top surfaces of the semiconductor components 1 as is evident from FIGS. 5a and 5b.

In high-voltage applications, the laminated insulating film 12 may be weakened by mechanical stress in the region of the edges of the semiconductor components (for example edge 14 in FIGS. 5a and 5b) due to heavy deformation in its insulating effect, as a result of which the insulation spacing between the potential of the bottom substrate which is also in contact with the top edge of the semiconductor and the potential of the metallization is diminished. When a vertical edged component is concerned a significantly diminished potential difference exists between semiconductor and metallization in the region of the weakening of the laminated film. In addition to this, beveling the edges of the semiconductor component, as shown in FIG. 5b, reduces the geometric weakening of the laminated film.

Figure 2:
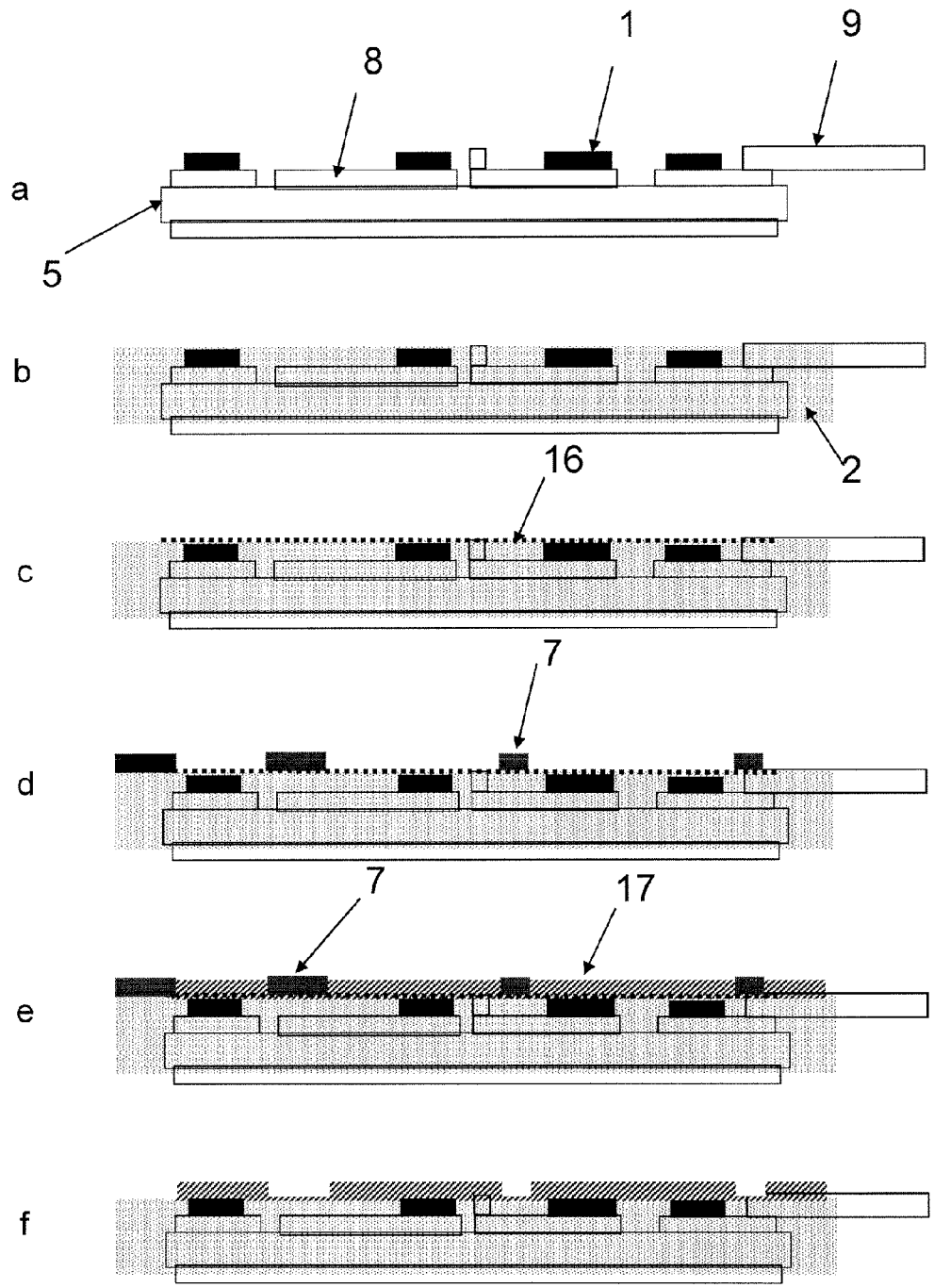
FIGS. 2a-2f illustrate processes in forming an example semiconductor module.
Figure 3:
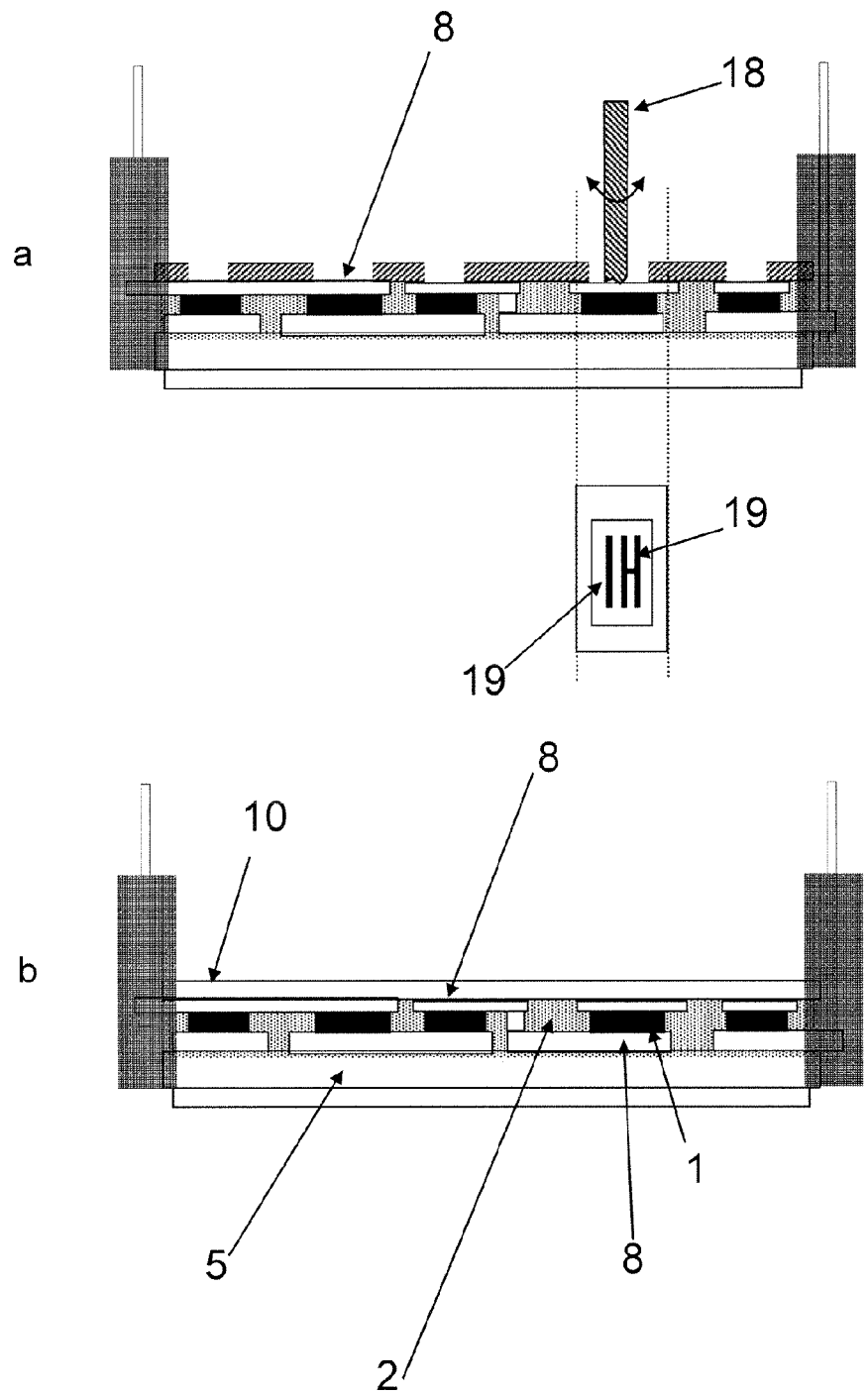
FIGS. 3a, 3b illustrate partial section views of further example semiconductor modules.
Figure 6:
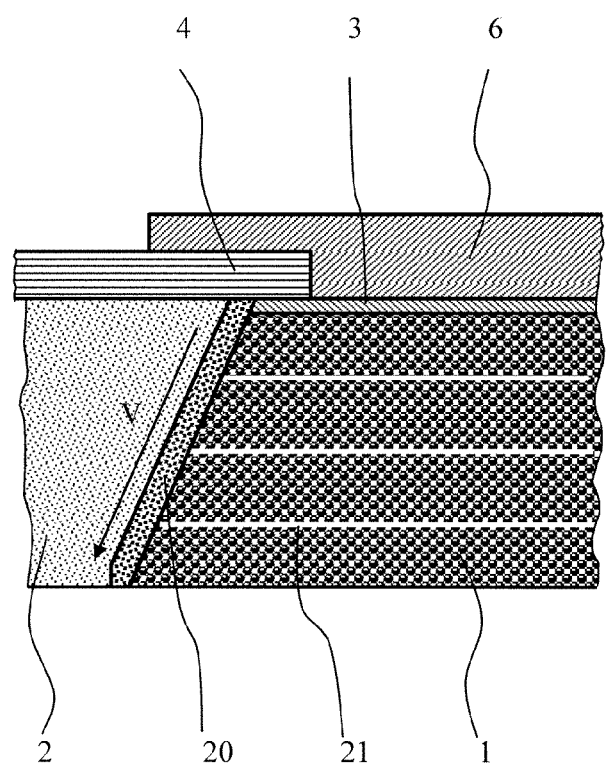
FIG. 6 is a section view of the edge zone of a semiconductor component in which the cavity between substrate and top of the semiconductor component is packed with an insulator.

FIG. 6 illustrates how the structures illustrated in FIGS. 2 to 4 can also be optionally encapsulated by packing the cavities between the substrate and the top surface of the semiconductor with an insulator. The bottom of the semiconductor component 1 as illustrated is in contact with a substrate (not illustrated), for example a direct copper bonding (DCB) substrate and is connected by its bottom contact electrode to a metallization of this substrate. The top contact pad 3 of the semiconductor component is coated with a top patterned metallization 6.

An optionally provided masking film 4 made of an insulator extends, for example, planar along the top of the semiconductor component 1 such that its bottom is level with the top of the contact pad 3 of the semiconductor component. Where the contact pad 3 of the semiconductor component 1 is connected to the patterned metallization 6 the masking film 4 is holed. The top patterned metallization 6 is located on the masking film 4, forming, among other things, the top contact electrode.

A side edge 20 of the semiconductor component 1 is in contact with the side edge of the semiconductor component 1, its surface may include a semiconductor layer which although a high impedance is still conducting to a certain extent. Since the contact electrodes for the main current—respectively in an OFF state for a blockade voltage—extend exclusively over the top or bottom of the semiconductor component, equipotential surfaces 21 of the electrical field are oriented in a barrier layer configured between the terminals parallel to the top and bottom of the semiconductor component. Because of the blockade voltage no electric field strength must occur at the top and bottom which would include a component in the plane of these surfaces. So that the field strength is the same in all of the level despite the specific resistance in the barrier layer changing with the level therein, the edge of the barrier layer can be configured ramped, as illustrated, so that the cross-sectional surface of the barrier layer changes with the level. Such forms of semiconductor component cross-sections can be fabricated, for example, by etching.

By the masking film 4 the live edge portion of the barrier layer is additionally covered to the top of the semiconductor component. This now makes it possible to track not only the top of the semiconductor component on the masking film with no problem, but also beyond the edge of the top of the semiconductor component, making for much less positioning accuracy of the masking film on the semiconductor component being necessary, as compared to known types, thus saving costs. A further cost-saving embodiment materializes from the masking film only needing to extend in a single plane, resulting in it being hardly mechanical stressed so that more cost-effective film materials and simpler coating processes can be applied.

To locate the masking film 4 exclusively in a single plane the space remaining with the semiconductor components and further parts between the masking film 4 and the substrate is packed with an insulating compound 2, for example a plastics or silicone compound. In addition the insulating compound and masking film can be applied by potting the die as a whole including the substrate and the semiconductor components as well as other optional parts (such as for example metallic connectors 8), the masking film 4 being arranged at the top planar interface of this composite.

The planar surface materializing after release can be topped by a two-dimensional connecting pattern of metallic conductors. This can be done by surface application of a plated layer or by application of a masking film or lead carrier by using bonding, welding, low-temperature sintering, soldering or adhesive cementing.

As explained above, a semiconductor module is fabricated, including for example, a substrate and at least one semiconductor component contacting the latter by its base surface and configured, for example, as a flat chip. The main current branch of the semiconductor component is sandwiched between the bottom (base) and top (deck) of the semiconductor component. The side edge surface of a barrier layer zone extends only at one side edge surface of the semiconductor component. The space above the substrate around the semiconductor component and, where a multitude of semiconductor components are sited on the substrate, between the semiconductor components is packed with an insulating compound at least up to the level of the top contacting surfaces of the semiconductor component(s) so that the insulating compound by itself or together with the contacting surface(s) of the semiconductor component(s) form a planar surface located parallel to the top surface of the individual semiconductor components. Applied to this planar surface is a two-dimensional metallization via which contact pads at the top of the semiconductor component(s) are contacted.

Since the side edge surface of the barrier layer zone is not located in the plane of the contact pads, the electrical field automatically materializing along this edge surface is no obstacle to contacting the top of the semiconductor component. Potting the topography of the assembly topping the semiconductor component with an insulating compound forms a planar surface which can be circuited by cost-effective means which are well versed technically via which the contact pads topping the semiconductor component can be powered to advantage, namely with no risk of breakdown, low inductiveness and low ohmic resistance.

Using a multitude of semiconductor components in a module instead of just a single semiconductor component adds to the advantages since the possibilities of powering the assembly via a planar metallization topping the semiconductor component offer more advantages.

However, also the planar surface topping the potting compound and the semiconductor components can be covered by a planar insulating masking film on which a conductor pattern is configured. Since the masking film is insulating, it can also extend beyond the edge portions of the semiconductor components without the risk of flashovers occurring, thus gaining room for tracks on the film. Since the masking film only needs to extend in one plane, applying it is simple whilst being exposed to no deformation or mechanical stress whatsoever, this including the conductors applied thereto.

The metallization topping the semiconductor components may be part of a further substrate so that the semiconductor components are sandwiched between two substrates, resulting in a both compact and rugged architecture even where complicated circuitry is concerned involving a lot of contacts and finely patterned conductors.

In one or more embodiments, fabricating the modules as described above involves the following processes: bonding the metallization of a substrate to the bottom contact plane of the semiconductor component(s), packing, for instance by potting, the space above the substrate and enveloping the semiconductor component(s) at least up to the top thereof with an insulating cementing compound to form a low-profile body, applying a planar metallization to the top plane of the semiconductor components at the side of the planar prismatic body facing away from the substrate and bonding this metallization to the contact pads at the top of the semiconductor components.

As an alternative, potting with the insulating cementing compound can first be done before topping it with the metallization as is applicable to a multitude of processes of track production.

As an alternative embodiment, however, tracks can be plated to the top of the body formed by the substrate and semiconductor component(s) and insulating compound as is equally well suited for achieving fine track patterns and large conductor cross-sections.

In accordance with another embodiment of the process the module including substrate, semiconductor components as well as other optional components can be potted as a whole with plastics material and a masking film applied to the top planar interface of the potting compound so that the masking film is bonded to the metallization by sealing, thus exploiting the adhesive property of the insulating compound which is in any case liquified to cement the masking film.

In accordance with another embodiment of the process semiconductor components can be sandwiched between two substrates interfacing a planar prismatic cavity and packing the part of this cavity remaining adjoining the semiconductor component(s) between the substrates with the insulating compound. In this way, even complicated and filigree dice can now be unified into a compact rugged component by safe automated processes having a proven record of success.

Although the present invention and its advantages have been described in detail, it should be understood that various changes, substitutions, and alterations can be made herein without departing from the spirit and scope of the invention as defined by the appended claims. For example, it will be readily understood by those skilled in the art that the voltages and their polarities may be altered while remaining within the scope of the present invention.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor module comprising:
   a substrate and at least two semiconductor components each with a top and with a bottom, the bottoms being in electrical contact with the substrate, wherein each of the semiconductor components includes side edge portions between the top and the bottom, and a vertical edge termination;
   each of the at least two semiconductor components comprises a contact pad arranged on the top of the respective semiconductor component, the respective contact pad comprising a top facing away from the substrate;
   wherein a space above the substrate and to a side of the semiconductor components is packed with an insulating compound up to a level of the tops of the contact pads so that the tops of the contact pads are in line with a body formed by the insulating compound; and
   a patterned or unpatterned planar metallization topping the semiconductor components and electrically connected to the contact pads.

2. The semiconductor module of claim 1, wherein a multitude of semiconductor components are sited on a common substrate and potted by the insulating compound together with the substrate into a low-profile body.

3. The semiconductor module as set forth in claim 2 wherein at least one semiconductor component is topped by an electrically insulating masking film sited or by an electrically insulating laminated film metallized at the side facing away from the at least one the semiconductor component.

4. The semiconductor module as set forth in claim 1 wherein at least one semiconductor component is topped by an electrically insulating masking film sited or by an electrically insulating laminated film metallized at the side facing away from the at least one the semiconductor component.

5. The semiconductor module of claim 1, wherein the metallization topping the semiconductor component is part of a further substrate.

6. A power semiconductor module comprising:
   a substrate and at least two semiconductor components each with a top and with a bottom, the bottoms being in electrical contact with the substrate, wherein each of the at least two semiconductor components comprises a vertical edge termination arranged at side edge portions formed between the top and the bottom of the respective semiconductor component; wherein
   a space above the substrate and to a side of the at least two semiconductor components is packed with an insulating compound up to a level of the tops of the semiconductor components, so as to form a plain surface; and wherein
   a patterned or unpatterned planar metallization is arranged on the plain surface for electrically contacting the tops of the semiconductor components.

7. A semiconductor module comprising:
   a substrate and at least two semiconductor components each with a top and with a bottom, the bottoms being in electrical contact with the substrate, wherein each of the semiconductor components includes a side edge portion formed between the top and the bottom;
   each of the at least two semiconductor components comprises a vertical edge termination arranged at the side edge portion formed between the top and the bottom of the respective semiconductor component;
   each of the at least two semiconductor components comprises a contact pad arranged on the top of the respective semiconductor component, the respective contact pad comprising a top facing away from the substrate;
   an insulating compound packing a space above the substrate and to a side of the semiconductor components up to a level of the tops of the contact pads so that the tops of the contact pads are in line with a body formed by the insulating compound; and
   a patterned or unpatterned planar metallization topping the semiconductor components and parallel thereto electrically connected to the contact pads.

8. The semiconductor module of claim 7, wherein a multitude of semiconductor components are sited on a common substrate and potted by the insulating compound together with the substrate into a low-profile body.

9. The semiconductor module of claim 2, wherein at least one semiconductor component is topped by an electrically insulating masking film sited or by an electrically insulating laminated film metallized at a side facing away from the at least one the semiconductor component.

10. The semiconductor module of claim 1 wherein at least one semiconductor component is topped by an electrically insulating masking film sited or by an electrically insulating laminated film metallized at the side facing away from the at least one the semiconductor component.

11. The semiconductor module of claim 1, wherein the metallization topping the semiconductor component is part of a further substrate.

* * * * *